(12) United States Patent
Yamada

(10) Patent No.: US 6,667,214 B2
(45) Date of Patent: Dec. 23, 2003

(54) NON-VOLATILE SEMICONDUCTOR MEMORY DEVICES AND METHODS FOR MANUFACTURING THE SAME

(75) Inventor: Kenji Yamada, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/091,551

(22) Filed: Mar. 7, 2002

(65) Prior Publication Data

US 2002/0145155 A1 Oct. 10, 2002

(30) Foreign Application Priority Data

Mar. 7, 2001 (JP) ........................................ 2001-063103

(51) Int. Cl.$^7$ .......................................... H01L 21/8236
(52) U.S. Cl. ........................ 438/276; 438/257; 438/264; 438/277
(58) Field of Search ................................. 438/257, 258, 438/264, 265, 266, 267, 276, 277

(56) References Cited

U.S. PATENT DOCUMENTS

| | | | |
|---|---|---|---|
| 6,133,097 A | * 10/2000 | Hsieh et al. | 438/266 |
| 6,171,908 B1 | * 1/2001 | Chen | 438/266 |
| 6,174,771 B1 | * 1/2001 | Leu | 438/257 |
| 6,184,088 B1 | * 2/2001 | Kurooka et al. | 438/264 |
| 6,194,269 B1 | * 2/2001 | Sung et al. | 438/258 |
| 6,323,085 B1 | * 11/2001 | Sandhu et al. | 438/257 |
| 6,337,250 B2 | * 1/2002 | Furuhata | 438/301 |
| 6,399,441 B1 | * 6/2002 | Ogura et al. | 438/257 |
| 6,486,508 B1 | * 11/2002 | Lee | 257/316 |

* cited by examiner

Primary Examiner—Eddie Lee
Assistant Examiner—N. Drew Richards
(74) Attorney, Agent, or Firm—Konrad Raynes Victor & Mann, LLP; Alan S. Raynes

(57) ABSTRACT

Examples including non-volatile semiconductor memory devices in which digitized image data and voice data can be more efficiently written and read, and methods for manufacturing the same, are described. In one example, a non-volatile semiconductor memory device 300 may include a first memory element 100 and a second memory element 200 formed in a wafer 11 and mutually isolated by an element isolation region 38, a first impurity diffusion layer 16 and a second impurity diffusion layer 14. The first and second memory elements 100 and 200 include gate dielectric layers 20 and 120, floating gates 22 and 122, selective oxide dielectric layers 24 and 124 and third impurity diffusion layers 15 and 25, respectively, and also include a common intermediate dielectric layer 26 and a common control gate 28, and connected to the first and second impurity diffusion layers 16 and 14 that are commonly shared.

21 Claims, 14 Drawing Sheets

NON-VOLATILE SEMICONDUCTOR MEMORY DEVICES AND METHODS FOR MANUFACTURING THE SAME

Applicant hereby incorporates by reference Japanese Application No. 2001-063103, filed Mar. 7, 2001, in its entirety.

1. Technical Field

The present invention relates to non-volatile semiconductor memory devices, and includes non-volatile semiconductor memory devices in which three kinds of data can be written and read at one memory cell unit.

2. Related Art

Non-volatile semiconductor memory devices have certain desired characteristics, for example, they are better suited for development towards greater capacity than DRAMs and SRAMs, and are also capable of high-speed access.

In particular, in recent years, non-volatile semiconductor memory devices whose memory capacity can be readily expanded and in which digitized image data and voice data can be more efficiently written and read are required.

SUMMARY

Embodiments relate to a non-volatile semiconductor memory device including a semiconductor substrate and an impurity region and an element isolation region formed in the semiconductor substrate. The device also includes first and second memory elements mutually isolated by the element isolation region. The impurity region includes a first impurity diffusion layer and a second impurity diffusion layer. The first and second memory elements each include a gate dielectric layer, a floating gate, a selective oxide dielectric layer and a third impurity diffusion layer, and also include a common intermediate dielectric layer and a common control gate, and also are connected to the first and second impurity diffusion layers. The third impurity diffusion layer located in each of the first and second memory elements includes a channel region, and an impurity concentration of the third impurity diffusion layer located in the first memory element is different from an impurity concentration of the third impurity diffusion layer located in the second memory element.

Embodiments also relate to a non-volatile semiconductor memory device including a semiconductor substrate and an impurity region and an element isolation region formed in the semiconductor substrate. The device also includes first and second memory elements mutually isolated by the element isolation region. The impurity region includes a first impurity diffusion layer and a second impurity diffusion layer. The first memory element and the second memory element each include a gate dielectric layer, a floating gate, a selective oxide dielectric layer and a third impurity diffusion layer, and also include a common intermediate dielectric layer and a common control gate, and also are connected to the first and second impurity diffusion layers. The first impurity diffusion layer is electrically connected to a bit line. The third impurity diffusion layer in each of the first and second memory elements includes a channel region. A threshold voltage of the first memory element and a threshold voltage of the second memory element are set at different values.

Embodiments also relate to a method for manufacturing a non-volatile semiconductor memory device including a first memory element and a second memory element, the method for manufacturing a non-volatile semiconductor memory device including: (a) forming an element isolation region in a semiconductor substrate to isolate the first memory element from the second memory element; (b) introducing an impurity in each of two regions isolated by the element isolation region in the semiconductor substrate to thereby form a third impurity diffusion layer in the first memory element in one of the two regions and to form a third impurity diffusion layer in the second memory element in another region of the two regions, wherein the third impurity diffusion layer in each of the first and second memory elements is formed such that an impurity concentration of the third impurity diffusion layer in the first memory element and an impurity concentration of the third impurity diffusion layer in the second memory element are different from each other; (c) forming a gate dielectric layer, a floating gate and a selective oxide dielectric layer for each of the first memory element and the second memory element in each of the two regions isolated by the element isolation region on the semiconductor substrate; (d) successively depositing a dielectric layer for forming an intermediate dielectric layer and a conduction layer and then patterning the dielectric layer and the conduction layer into a specified shape to form an intermediate dielectric layer and a control gate commonly shared by the first memory element and the second memory element; and (e) introducing an impurity into a specified region of the semiconductor substrate to form an impurity region that includes the first and second impurity diffusion layers, to thereby form the first memory element and the second memory element.

Embodiments also include a method for manufacturing a non-volatile semiconductor memory device including a first memory element and a second memory element, the method for manufacturing a non-volatile semiconductor memory device comprising the steps of: (a) forming an element isolation region in a semiconductor substrate to isolate the first memory element from the second memory element, and then successively forming a dielectric layer for forming a gate dielectric layer and a conduction layer for forming a floating gate; (b) introducing an impurity in each of two regions isolated by the element isolation region in the semiconductor substrate to thereby form a third impurity diffusion layer in the first memory element in one of the two regions and to form a third impurity diffusion layer in the second memory element in another region of the two regions, wherein the third impurity diffusion layer in each of the first and second memory elements is formed such that an impurity concentration of the third impurity diffusion layer in the first memory element and an impurity concentration of the third impurity diffusion layer in second memory element are different from each other; (c) selectively oxidizing a part of the conduction layer for forming a floating gate to thereby form a selective oxide dielectric layer for the first memory element and the second memory element, and then patterning the dielectric layer for forming a gate dielectric layer and the conduction layer for forming a floating gate into a specified shape, to thereby form a gate dielectric layer and a floating gate for each of the first memory element and the second memory element in the respective two regions isolated by the element isolation region on the semiconductor substrate; (d) successively depositing a dielectric layer for forming an intermediate dielectric layer and a conduction layer for forming a control gate and then patterning the dielectric layer and the conduction layer for forming a control gate into a specified shape to form an intermediate dielectric layer and a control gate commonly shared by the first memory element and the second memory element; and (e) introducing an impurity into a specified region of the semiconductor substrate to form an impurity region that includes the first and second impurity diffusion layers, to thereby form the first memory element and the second memory element.

Embodiments also relate to a method for manufacturing a non-volatile semiconductor memory device including a first memory element in a first memory element region and a second memory element in a second memory element region. The method includes providing a semiconductor substrate including a first memory element region and a second memory element region. The method also includes forming a third impurity diffusion layer in each of the first and second memory element regions, wherein an impurity concentration of the third impurity diffusion layer in the first memory element region is different from an impurity concentration of the third impurity diffusion layer in the second memory element region. The method also includes forming a gate dielectric layer, a floating gate and a selective oxide dielectric layer in each of the first memory element region and the second memory element region. The method also includes depositing a dielectric layer and depositing a conduction layer and patterning the dielectric layer and the conduction layer to form an intermediate dielectric layer and a control gate commonly shared by the first memory element and the second memory element. In addition, the method includes forming first and second impurity diffusion layers in selected regions of the semiconductor substrate.

In an embodiment related to that described in the paragraph above, forming the third impurity diffusion layer in each of the first and second memory element regions may be carried out prior to forming the gate dielectric layer, the floating gate, and the selective oxide dielectric layer in each of the first and second memory element regions. In another embodiment related to that described in the paragraph above, forming the third impurity diffusion layer in each of the first and second memory element regions may be carried out after forming the gate dielectric layer, the floating gate, and the selective oxide dielectric layer in each of the first and second memory element regions.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
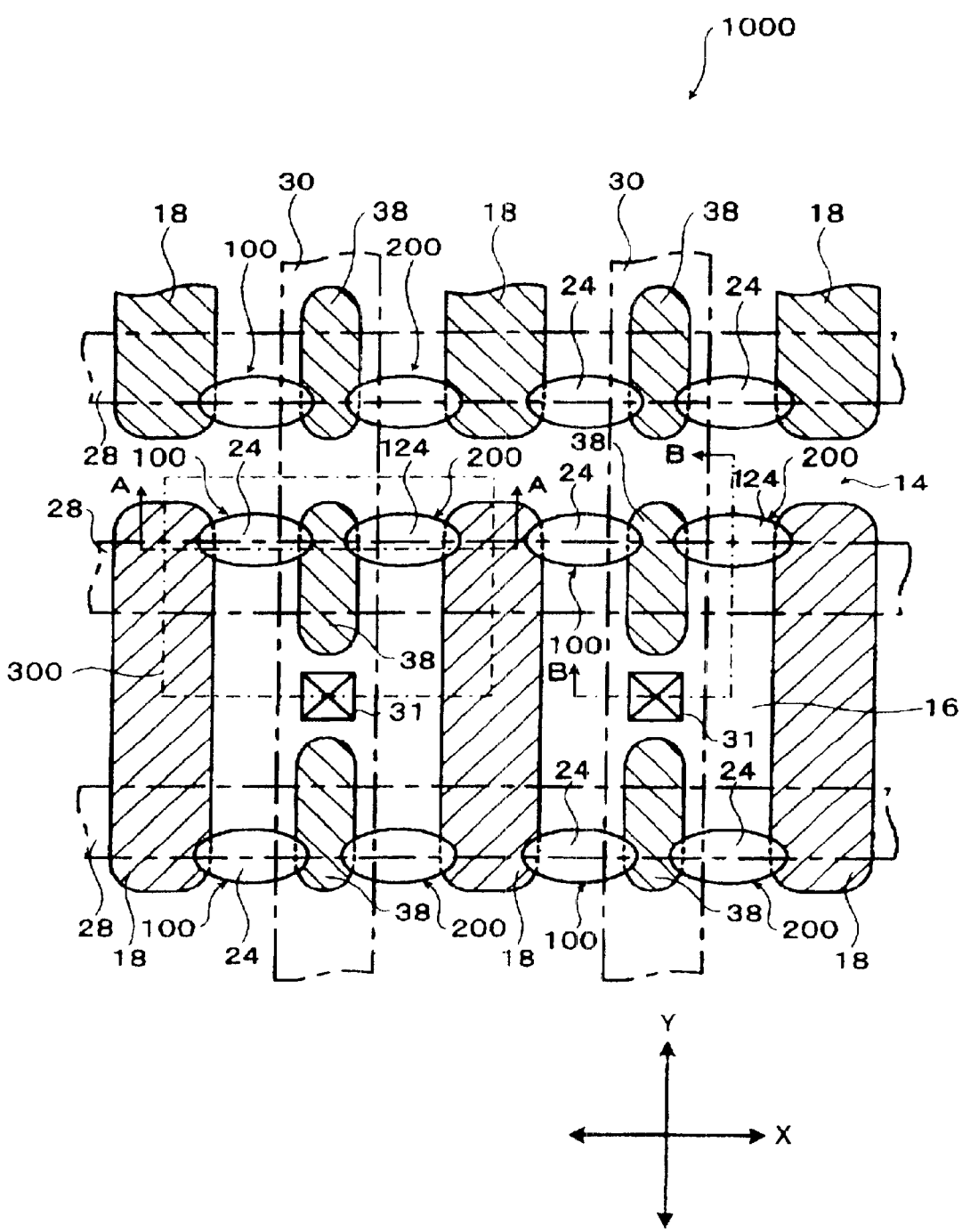
FIG. 1 schematically shows a plan view of a non-volatile semiconductor memory device in accordance with one embodiment of the present invention.

Certain embodiments relate to non-volatile semiconductor memory devices whose memory capacity can be readily expanded and in which digitized image data and voice data can be more efficiently written and read and methods for manufacturing the same.

A non-volatile semiconductor memory device in accordance with one embodiment of the present invention comprises:

a semiconductor substrate;

an impurity region and an element isolation region formed in the semiconductor substrate; and first and second memory elements formed in the semiconductor substrate and mutually isolated by the element isolation region, the impurity region including a first impurity diffusion layer and a second impurity diffusion layer, the first memory element and the second memory element each including a gate dielectric layer, a floating gate, a selective oxide dielectric layer and a third impurity diffusion layer, also including a common intermediate dielectric layer and a common control gate, and being connected to the common first and second impurity diffusion layers, the third impurity diffusion layer composing a portion of each of the first and second memory elements including a channel region, and an impurity concentration of the third impurity diffusion layer composing a portion of the first memory element being different from an impurity concentration of the third impurity diffusion layer composing a portion of the second memory element.

In accordance with certain aspects of the present embodiment, the impurity concentration of the third impurity diffusion layer composing a portion of the first memory element is different from the impurity concentration of the third impurity diffusion layer composing a portion of the second memory element, such that the threshold voltage of the first memory element and the threshold voltage of the second memory element are set at different values. As a result, at the time of writing and reading data, three different kinds of data can be written and read, which are provided due to the difference in the threshold voltages between the first and second memory elements, by three different modes that drive one of the first and second memory elements, both of them, or neither of them. Accordingly, by applying this to an apparatus that needs to discriminate three types of data from one another, such as a color CCD and a color liquid crystal display apparatus, storage and reading of data can be efficiently executed.

In this case, the first impurity diffusion layer may preferably be electrically connected to a bit line.

A non-volatile semiconductor memory device in accordance with a second embodiment of the present invention comprises:

a semiconductor substrate;

an impurity region and an element isolation region formed in the semiconductor substrate; and first and second memory elements formed in the semiconductor substrate and mutually isolated by the element isolation region, the impurity region including a first impurity diffusion layer and a second impurity diffusion layer, the first memory element and the second memory element each including a gate dielectric layer, a floating gate, a selective oxide dielectric layer and a third impurity diffusion layer, also including a common intermediate dielectric layer and a common control gate, and being connected to the common first and second impurity diffusion layers, the first impurity diffusion layer being electrically connected to a bit line, the third impurity diffusion layer composing a portion of each of the first and second memory elements including a channel region, and a threshold voltage of the first memory element and a threshold voltage of the second memory element being set at different values.

According to the structure described above, functions and effects that are similar to those of the first non-volatile semiconductor memory device embodiment described above are provided.

Also, the first and second non-volatile semiconductor memory devices described above may have the following features described in additional embodiments (1) through (3) listed below.

(1) The first memory element and the second memory element may be electrically connected to a common bit line through the first impurity diffusion layer.

(2) An interlayer dielectric layer formed over the first memory element and the second memory element and a contact section passing through the interlayer dielectric layer may be included, and the first impurity diffusion layer may preferably be connected to the bit line through the contact section.

(3) The third impurity diffusion layer included in each of the first and second memory elements may be formed in a section between the first impurity diffusion layer and the second impurity diffusion layer, and immediately below the gate dielectric layer and the control gate.

A first method embodiment for manufacturing a non-volatile semiconductor memory device pertains to a method for manufacturing a non-volatile semiconductor memory device including a first memory element and a second memory element, which includes the steps (a) through (e) as follows:

(a) Step of forming an element isolation region in a semiconductor substrate for isolating the first memory element from the second memory element;

(b) Step of introducing an impurity in each of two regions isolated by the element isolation region in the semiconductor substrate to thereby form a third impurity diffusion layer composing a portion of the first memory element in one of the two regions and to form a third impurity diffusion layer composing a portion of the second memory element in another region of the two region, wherein the third impurity diffusion layer composing a portion of each of the first and second memory elements is formed such that an impurity concentration of the third impurity diffusion layer composing a portion of the first memory element and an impurity concentration of the third impurity diffusion layer composing a portion of the second memory element are different from each other;

(c) Step of forming a gate dielectric layer, a floating gate and a selective oxide dielectric layer that compose a portion of each of the first memory element and the second memory element in each of the two regions isolated by the element isolation region on the semiconductor substrate;

(d) Step of successively depositing a dielectric layer for forming an intermediate dielectric layer and a conduction layer and then patterning the dielectric layer and the conduction layer into a specified shape to form an intermediate dielectric layer and a control gate commonly shared by the first memory element and the second memory element; and (e) Step of introducing an impurity into a specified region of the semiconductor substrate to form an impurity region that includes the first and second impurity diffusion layers, to thereby form the first memory element and the second memory element.

By the method in accordance with the present embodiment, the impurity concentration of the third impurity diffusion layer composing a portion of the first memory element and the impurity concentration of the third impurity diffusion layer composing a portion of the second memory element are made to be different from each other, such that the threshold voltages of the first memory element and the second memory element can be set at different values. As a result, a non-volatile semiconductor memory device that can write and read three kinds of data can be manufactured by a simplified method.

In particular, the concentrations of the impurity introduced respectively in the third impurity diffusion layer composing a portion of the first memory element and the third impurity diffusion layer composing a portion of the second memory element may preferably be made different to set the threshold voltage of the first memory element and the threshold voltage of the second memory element at different values. According to this method, the concentrations of the impurity introduced in the third impurity diffusion layers respectively composing a portion of the first memory element and the second memory element are changed from one another, such that the threshold voltages of the first and second memory elements can be readily adjusted.

A second method embodiment for manufacturing a non-volatile semiconductor memory device pertains to a method for manufacturing a non-volatile semiconductor memory device including a first memory element and a second memory element, which includes the steps (a) through (e) as follows:

Step (a) of forming an element isolation region in a semiconductor substrate for isolating the first memory element from the second memory element, and then successively forming a dielectric layer for forming a gate dielectric layer and a conduction layer for forming a floating gate;

Step (b) of introducing an impurity in each of two regions isolated by the element isolation region in the semiconductor substrate to thereby form a third impurity diffusion layer composing a portion of the first memory element in one of the two regions and to form a third impurity diffusion layer composing a portion of the second memory element in another region of the two region, wherein the third impurity diffusion layer composing a portion of each of the first and second memory elements is formed such that an impurity concentration of the third impurity diffusion layer composing a portion of the first memory element and an impurity concentration of the third impurity diffusion layer composing the second memory element are different from each other;

Step (c) of selectively oxidizing a part of the conduction layer for forming a floating gate to thereby form a selective oxide dielectric layer that composes a portion of the respective first memory element and the second memory element, and then patterning the dielectric layer for forming a gate dielectric layer and the conduction layer for forming a floating gate into a specified shape, to thereby form a gate dielectric layer and a floating gate that compose each of the first memory element and the second memory element in the two regions isolated by the element isolation region on the semiconductor substrate;

Step (d) of successively depositing a dielectric layer for forming an intermediate dielectric layer and a conduction layer for forming a control gate and then patterning the dielectric layer and the conduction layer for forming a control gate into a specified shape to form an intermediate dielectric layer and a control gate commonly shared by the first memory element and the second memory element; and Step (e) of introducing an impurity into a specified region of the semiconductor substrate to form an impurity region that includes the first and second impurity diffusion layers, to thereby form the first memory element and the second memory element.

By the method according to the present embodiment, functions and effects similar to those of the first method embodiment for manufacturing a non-volatile semiconductor memory device described above are provided.

Also, in the first and second methods for manufacturing non-volatile semiconductor memory devices described above may have the following features described in additional method embodiments (1) through (4).

(1) Further, the following steps (f) and (g) may be included.

Step (f) of forming an interlayer dielectric layer over the first memory element and the second memory element, and then forming a contact section that passes through the interlayer dielectric layer over the first impurity diffusion layer; and Step (g) of embedding a conduction layer in the contact section and forming a bit line that connects to the conduction layer on the interlayer dielectric layer.

In this case, the step (g) may preferably be a step for electrically connecting the conduction layer and the first impurity diffusion layer.

Also, in this case, the step (g) may preferably be a step for electrically connecting the bit line to the first and second memory elements as a common bit line for the first and second memory elements.

(2) The step (b) may preferably be a step for introducing an impurity in specified amounts in the respective two regions isolated by the element isolation region in the semiconductor substrate to thereby form the third impurity diffusion layer composing a portion of the respective first and second memory elements such that an impurity concentration of the third impurity diffusion layer composing a portion of the first memory element and an impurity concentration of the third impurity diffusion layer composing a portion of the second memory element are different from each other.

(3) In the step (b), the impurity may preferably be introduced in a specified region in the semiconductor substrate immediately below the control gate to set such that an impurity concentration of the third impurity diffusion layer composing a portion of the first memory element and an impurity concentration of the third impurity diffusion layer composing a portion of the second memory element are different from each other.

(4) Further, the following step (h) may be included.

(h) An impurity may preferably be introduced at least in a part of the semiconductor substrate before forming the gate dielectric layer in the step (c).

In this case, more preferably, the step (h) may be a step for forming an impurity region in a section immediately below the control gate in the semiconductor substrate.

Certain preferred embodiments of the present invention are described below with reference to the accompanying drawings.

Figure 2:
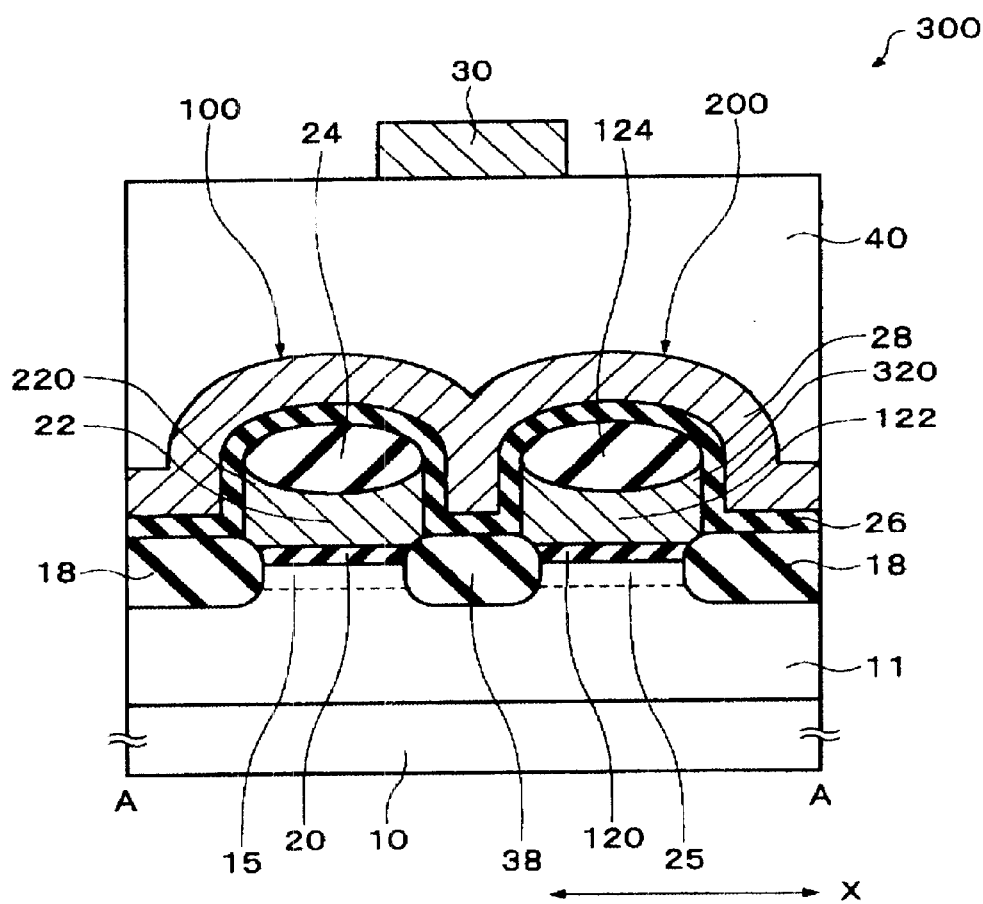
FIG. 2 shows a cross-sectional view taken along a line A—A of the non-volatile semiconductor memory device shown in FIG. 1.

FIG. 1 schematically shows a plan view of a non-volatile semiconductor memory device 300 in accordance with an embodiment of the present invention, and FIG. 2 shows a cross-sectional view taken along a line A—A of the non-volatile semiconductor memory device 300 shown in FIG. 1.

The non-volatile semiconductor memory device 300 is formed on a semiconductor substrate (for example, silicon substrate) 10 of a second conductivity type (for example, P type), and includes a first memory element 100 and a second memory element 200, a first impurity diffusion layer 16 and a second impurity diffusion layer 14 of a first conductivity type (for example, N type), and element isolation regions 18 and 38. The first impurity diffusion layers 16 and the second impurity diffusion layers 14 are source/drain regions. In the present embodiment, the first conductivity type is defined to be N-type, and the second conduction is defined to be P-type.

As shown in FIG. 1, a memory cell array 1000 is formed from the first and second memory elements 100 and 200 that comprise the non-volatile semiconductor memory devices 300. In the memory cell array 1000, the non-volatile semiconductor memory devices 300 including the first and second memory elements 100 and 200 are arranged in lines in the X-direction (row direction) and the Y-direction (column direction). As shown in FIG. 1, the non-volatile semiconductor memory device 300 forms one memory cell unit including one set of the first and second memory elements 100 and 200 that are disposed next to each other in the X-direction. Furthermore, the first and second memory elements 100 and 200 disposed in lines in the Y-direction that form the non-volatile semiconductor memory devices 300 are alternately arranged. In this embodiment, each of the first and second memory elements 100 and 200 is a non-volatile memory transistor having a split-gate structure (hereafter referred to as "memory transistor").

Also, in the non-volatile semiconductor memory device 300, the first and second memory elements 100 and 200 are isolated from one another.

Referring to FIG. 1, one of the first memory elements 100 is disposed next to another of the first memory elements 100 in the Y-direction with the first impurity diffusion layer 16 being interposed between them, and is also disposed next to another of the first memory elements 100 with a common second impurity diffusion layer 14 being interposed between them. Similarly, one of the second memory elements 200 is disposed next to another of the second memory elements 200 in the Y-direction with the first impurity diffusion layer 16 being interposed between them, and is also disposed next to another of the second memory elements 200 with a common second impurity diffusion layer 14 being interposed between them.

Also, with respect to the non-volatile semiconductor memory devices 300 shown in FIG. 1, the element isolation regions 18 are disposed separated from one another by each two rows including pairs of the adjacent first and second memory elements 100 and 200. The first impurity diffusion layers 16 in the X-direction are provided at adjacent ones of the first and second memory elements 100 and 200 and separated from one another by the element isolation regions 18, and the second impurity diffusion layers 14 are continuous in the X-direction.

The first and second memory elements 100 and 200 that comprise the non-volatile semiconductor memory devices 300 are separated from one another by the element isolation region 38. Further, each of the first and second memory elements 100 and 200 includes a gate dielectric layer, a floating gate and a third impurity diffusion layer. In other words, the first memory element 100 includes a gate dielectric layer 20, a floating gate 22 and a selective oxide dielectric layer 24, and the second memory element 200 includes a gate dielectric layer 120, a floating gate 122 and a selective oxide dielectric layer 124.

Figure 3:
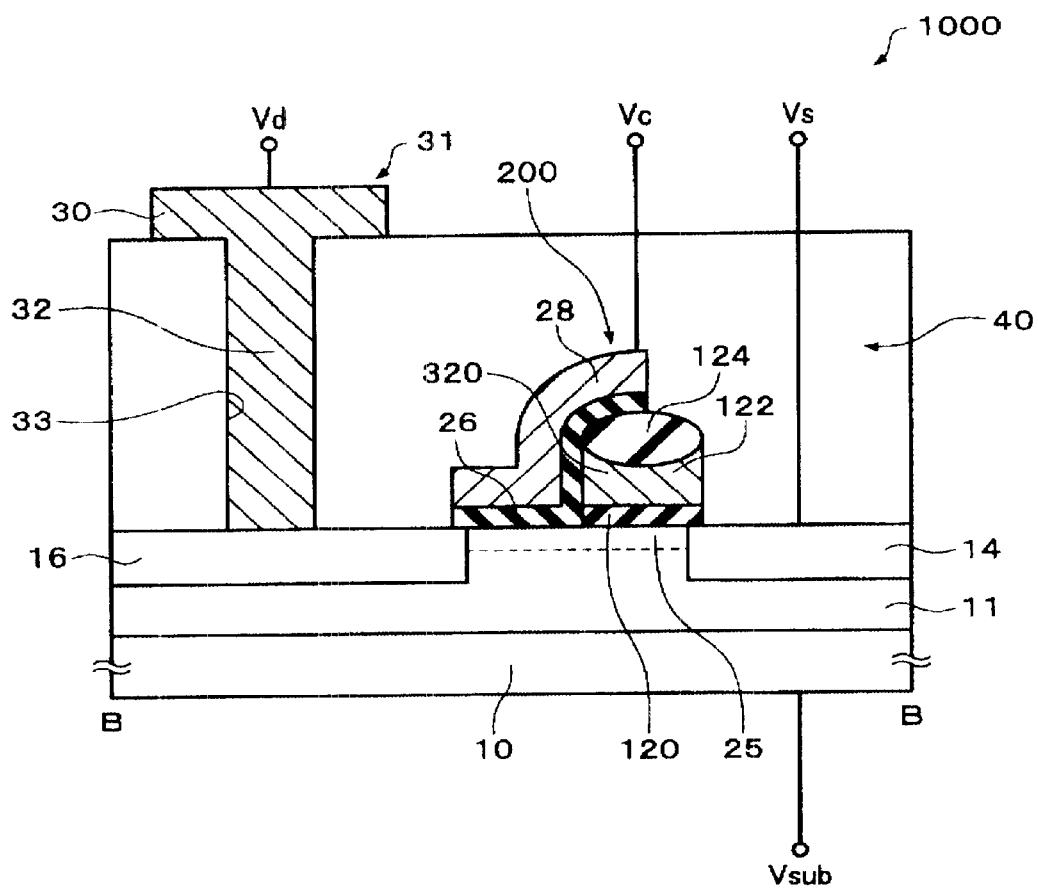
FIG. 3 shows a cross-sectional view taken along a line B—B of the non-volatile semiconductor memory device shown in FIG. 1.

The gate dielectric layer 20, the floating gate 22 and the selective oxide dielectric layer 24 that form the first memory element 100 are successively disposed in layers on a well 11 that is provided in the silicon substrate 10. Also, in the first memory element 100, a third interlayer dielectric layer 15 is formed in the well 11 between the first impurity diffusion layer 16 and the second impurity diffusion layer 14 immediately below the gate dielectric layer 20. In other words, the third-interlayer dielectric layer 15 is a region that includes the second conductivity type (P-type) impurity and includes an impurity region (channel region) that is formed immediately below the gate dielectric layer 20; and, as shown in FIG. 3, it is formed in the well 11 between the first impurity diffusion layer 16 and the second impurity diffusion layer 14, in other words, from a portion immediately below the gate dielectric layer 20 to a portion immediately below the intermediate dielectric layer 26 (and below control gate 28).

Furthermore, the first memory element 100 includes the intermediate dielectric layer 26 and the control gate 28 that are commonly shared by the second memory element 200, and is connected to the first and second impurity diffusion layers 16 and 14 that are commonly shared by the second memory element 200. In other words, as shown in FIG. 2, the intermediate dielectric layer 26 and the control gate 28 are continuous from the first memory element 100 to the second memory element 200, and the first and second impurity diffusion layers 16 and 14 are source/drain regions commonly shared by the first and second memory elements 100 and 200.

The gate dielectric layer 120, the floating gate 122 and the selective oxide dielectric layer 124 that form the second memory element 200 are successively disposed in layers on the well 11 that is provided in the silicon substrate 10. Also, in the second memory element 200, a third interlayer dielectric layer 25 is formed in the well 11 between the first impurity diffusion layer 16 and the second impurity diffusion layer 14 immediately below the gate dielectric layer 120. The third interlayer dielectric layer 25 is, similar to the third impurity diffusion layer 15 in the first memory element 100, a region that includes the second conductivity type (P-type) impurity and includes an impurity region (channel region) that is formed immediately below the gate dielectric layer 120; and it is formed in the well 11 between the first impurity diffusion layer 16 and the second impurity diffusion layer 14. In other words, the third impurity diffusion layer 25 is formed from a portion immediately below the gate dielectric layer 120 to a portion immediately below the intermediate dielectric layer 26 (and below control gate 28).

Furthermore, as described above, the second memory element 200 includes the intermediate dielectric layer 26 and the control gate 28 that are commonly shared by the first memory element 100, and connected to the first and second impurity diffusion layers 16 and 14 that are commonly shared by the first memory element 100.

The present embodiment is characterized in that the impurity concentration of the third impurity diffusion layer 15 that composes a portion of the first memory element 100 and the impurity concentration of the third impurity diffusion layer 25 that composes a portion of the second memory element 200 are different from one another. In other words, the concentrations of the second conductivity type (P-type) impurity respectively introduced in the third impurity diffusion layers 15 and 25 are different from one another. According to this composition, the threshold voltage of the memory element 100 and the threshold voltage of the second memory element 200 can be set at different values, such that three kinds of data can be written and read. Also, in the non-volatile semiconductor memory device 300 of the present embodiment, the first and second memory elements 100 and 200 are connected to a common bit wiring layer (bit line) 30 through the first impurity diffusion layer 16, such that one bit wiring layer 30 controls both of the first and second memory elements 100 and 200 in pairs that are arranged in Y-direction and adjacent with one another with the element isolation regions 38 being interposed between them. As a result, more efficient processing can be achieved. This will be described in detail in the operation method description below for a non-volatile semiconductor memory device in accordance with an embodiment of the present invention.

It is noted that, in the present embodiment, the description is made with respect to a case in which the impurity concentration of the third impurity diffusion layer 15 of the first memory element 100 is higher than the impurity concentration of the third impurity diffusion layer 25 of the second memory element 200. However, the impurity concentration of either of them may be higher than the other as long as the impurity concentrations of the third impurity diffusion layers 15 and 25 of the first and second memory elements are different from one another. In this case, the threshold voltage of the first memory element 100 is set to be higher than the threshold voltage of the second memory element 200.

The floating gates 22 and 122 of the first and second memory elements 100 and 200 are independently disposed for each of the memory elements. The control gate 28 extends in X-direction in a manner to overlap at least a part of the plurality of floating gates 22 and 122 at each of the rows as viewed in a plan view thereof. Also, the first impurity diffusion layer 16 of the first conductivity type (N-type) is formed between adjacent ones of the control gates 28. Further, the second impurity diffusion layer 14 of the first conductivity type (N-type) is disposed on the side opposite to the side where the first impurity diffusion layer 16 is formed in the first and second memory elements 100 and 200. The second impurity diffusion layer 14 is formed in the silicon substrate 10 in a similar manner as the first impurity diffusion layer 16. Also, the second impurity diffusion layer 14 is continuous in the X-direction, and extends in the X-direction.

Furthermore, the selective oxide dielectric layers 24 and 124 are formed respectively on the floating gates 22 and 122 that of the first and second memory elements 100 and 200, respectively. The selective oxide dielectric layers 24 and 124 are formed by patterning a dielectric layer that is formed by selectively oxidizing part of a polysilicon layer that becomes the floating gates 22 and 122, as described below. The selective oxide dielectric layers 24 and 124 each have a structure, as shown in FIG. 2, in which the film thickness thereof becomes thinner toward an end section thereof. As a result, as shown in FIG. 2, upper peripheral sections 220 and 320 of the floating gates 22 and 122 are formed to have an acute angle, such that electric field concentration is apt to take place at the upper peripheral sections 220 and 320.

Also, the gate dielectric layers 20 and 120, the floating gates 22 and 122 and the selective oxide dielectric layers 24 and 124 that respectively form the first and second memory elements 100 and 200 are formed in a manner that both ends of each of them overlap adjacent element isolation regions 18 and 38, as shown in FIG. 1.

Preferably, the intermediate dielectric layer 26 is commonly shared by the first memory element 100 and the second memory element 200 and is formed in a manner to extend from the side surfaces of the floating gates 22 and 122 over the surfaces of the selective oxide dielectric layers 24 and 124, and extend along the surface of the well 11 and reach one end of the first impurity diffusion layer 16. The intermediate dielectric layer 26 functions as a so-called tunneling dielectric layer.

The control gate 28 is formed on the intermediate dielectric layer 26. Preferably, the control gate 28 is commonly shared by the first memory element 100 and the second memory element 200 in a similar manner as the intermediate dielectric layer 26, and extends in X-direction.

Furthermore, as shown in FIG. 2, an interlayer dielectric layer 40 is formed over the well 11 where the first and second memory elements 100 and 200 are formed. Contact holes 33 that reach the first impurity diffusion layer 16 are formed in the interlayer dielectric layer 40 at specified regions, for example, as shown in FIG. 3, and contact conduction layers 32 are formed in the contact holes 33. Furthermore, the bit wiring layer 30 having a specified pattern is formed on the interlayer dielectric layer 40. Each of the control gates 28 defines a word line, the second impurity diffusion layer 14 extending in parallel with the control gate 28 defines a source line, and the bit wiring layer 30 that is connected to the first impurity diffusion layer 16 defines a bit line. In other words, the first impurity diffusion layer 16 is electrically connected to the bit wiring layer 30, and the first and second memory elements 100 and 200 are electrically connected to the common first impurity diffusion layer 16. Accordingly, the first and second memory elements 100 and 200 are electrically connected to the common bit wiring layer (bit line) 30 through the first impurity diffusion layer 16.

Next, one example of an operation method of the non-volatile semiconductor memory device 300 in accordance with the present embodiment is described with reference to FIG. 3.

Referring to FIG. 3, Vc indicates a voltage that is applied to the control gate 28, Vs indicates a voltage that is applied to the second impurity diffusion layer 14, Vd indicates a voltage that is applied to the first impurity diffusion layer 16, and Vsub indicates a voltage that is applied to the silicon substrate 10.

One example of a data writing operation is described below.

When the non-volatile semiconductor memory device 300 with a split-gate structure is operated, in a data writing operation, the second impurity diffusion layer 14 is set at a higher potential with respect to the first impurity diffusion layer 16, and a low potential is applied to the control gate 28. As a result, hot electrons are generated near the first impurity diffusion layer 16, and the hot electrons are accelerated toward the floating gate, and injected in the floating gate 22 (and/or floating gate 122) through the gate dielectric layer 20 (and/or the gate dielectric layer 120), such that data is written.

In accordance with the present embodiment, the impurity concentration of the third impurity diffusion layer 15 that of the first memory element 100 is different from the impurity concentration of the third impurity diffusion layer 25 of the second memory element 200, such that the threshold voltage of the first memory element 100 and the threshold voltage of the second memory element 200 are set at different values. By changing the voltage Vd that is applied to the first impurity diffusion layer 16, one of the states, i.e., writing data in one of the first and second memory elements 100 or 200, or writing data in both of the first and second memory elements 100 and 200, can be selected.

As described above, as one example of the present embodiment, the impurity concentration of the third impurity diffusion layer 15 of the first memory element 100 is higher than the impurity concentration of the third impurity diffusion layer 25 of the second memory element 200. As a result, the threshold voltage $V_{th1}$ of the first memory element 100 is set to be greater than the threshold voltage $V_{th2}$ of the second memory element 200. Accordingly, when the voltage $V_c$ that is applied to the control gate 28 is greater than the threshold voltage $V_{th2}$ of the second memory element 200, and smaller than the threshold voltage $V_{th1}$ of the first memory element 100, data is written only in the second memory element 200. This case may be defined that, for example, data "1" is stored. Also, when the voltage $V_c$ that is applied to the control gate 28 is greater than the threshold voltage $V_{th1}$ of the first memory element 100, data is written in both of the first and second memory elements 100 and 200. This case may be defined that, for example, data "0" is stored. When the voltage $V_c$ that is applied to the control gate 28 is smaller than the threshold voltage $V_{th2}$ of the second memory element 200, data is not written in both of the first and second memory element 100 and 200. This case may be defined that, for example, data "2" is stored.

In the non-volatile semiconductor memory device 200 in accordance with the present embodiment, at the time of writing data, three kinds of data "0", "1" and "2" can be written by the first and second memory elements 100 and 200 that of the non-volatile semiconductor memory device 300.

For example, in the writing operation, when the voltage (Vd) of the first impurity diffusion layer 16 is 2.5 V, the threshold voltage $V_{th2}$ of the second memory element 200 is 0.7 V, the potential (Vc) of the control gate 28 is 2 V, the potential (Vs) of the second impurity diffusion layer 14 is 10.5 V, the potential (Vd) of the first impurity diffusion layer 16 is 1 V and the potential (Vsub) of the silicon substrate 10 is 0 V, charge is injected only in the floating gate 122 of the second memory element 200. In other words, data is written only in the second memory element 200. On the other hand, when the threshold voltage $V_{th1}$ of the first memory element 100 is 1 V, charge is injected in both of the floating gates 22 and 122 of the first and second memory elements 100 and 200. In other words, data is written in both of the first and second memory elements 100 and 200.

At the time of erasing data, a specified high voltage is applied to the control gate 28 to thereby move the charge to the control gate 28 by FN conduction, whereby data in the first and second memory elements 100 and 200 are erased all together.

In an erasing operation, the potential of the control gate 28 is set to be higher than the potentials of the second impurity diffusion layer 14 and the first impurity diffusion layer 16. As a result, charges accumulated in the floating gates 22 and 122 that respectively of the first and second memory elements 100 and 200 are discharged from the upper peripheral sections 220 and 320 of the floating gates 22 and 122, passing through the intermediate dielectric layer 26 by FN conduction, to the control gate 28, whereby data is erased.

For example, in the erasing operation, when the potential (Vc) of the control gate 28 is 11.5 V, the potentials (Vs) and (Vd) of the second impurity diffusion layer 14 and the first impurity diffusion layer 16 are 0 V, and the potential (Vsus) of the silicon substrate 10 is 0 V, data stored in the first and second memory elements 100 and 200 are erased.

In a data reading operation, the first impurity diffusion layer 16 may be set at a high potential compared to the second impurity diffusion layer 14, and a specified potential is applied to the control gate 28, whereby a decision as to written data is made based on the presence or the absence of formed channels of the first and second memory elements 100 and 200.

In a non-volatile semiconductor memory device, in general, when a charge is injected in the floating gate, the potential of the floating gate becomes low, with the result that a channel is not formed and a drain current does not flow. Conversely, when charge is not injected in the floating gate, the floating gate has a high potential, with the result that a channel is formed and a drain current flows. Accordingly, by detecting drain currents flowing in the first and second memory elements 100 and 200 that of the non-volatile semiconductor memory device 300 by a sense amplifier, data can be read out.

In the present embodiment, when charges are injected in both of the floating gates 22 and 122 that respectively compose a portion of the first and second memory elements 100 and 200, potentials of both of the floating gates 22 and 122 become low, and therefore channels are not formed and drain currents do not flow in both of the first and second memory elements 100 and 200. In other words, in this case, since any current that may flow between the first impurity diffusion layer 16 and the second impurity diffusion layer 14 is not detected, a decision is made that the stored data is "0".

When a charge is injected in only the floating gate 122 that composes a portion of the second memory element 200, only the potential of the floating gate 122 becomes low, such that a channel is not formed and a drain current does not flow in the second memory element 200. On the other hand, in this case, since a charge is not injected in the floating gate 22 that composes a portion of the first memory element 100, a potential of the floating gate 22 becomes high, such that a channel is formed and a drain current flows. In other words, a drain current flows only in the first memory element 100. This drain current is measured. The current measured here is a drain current that flows only in the first memory element 100. A decision is made, from the amount of current that is obtained by measuring the drain current, that the data is "1".

Alternatively, when a charge is not injected in both of the floating gates 22 and 122 that respectively compose a portion of the first and second memory elements 100 and 200, potentials of both of the floating gates 22 and 122 become high, such that channels are formed and drain currents flow in both of the first and second memory elements 100 and 200. In other words, drain currents flow in both of the first and second memory elements 100 and 200. The currents measured in here are drain currents that flow in both of the first and second memory elements 100 and 200. A decision is made, from the amount of current obtained by measuring the drain currents, that the data is "2".

For example, in the reading operation, data is read out with the potential (Vc) of the control gate 28 being 1.0 V, the potential (Vs) of the second impurity diffusion layer 14 being 0 V, the potential (Vd) of the first impurity diffusion layer 16 being 3.0 V and the potential (Vsub) of the silicon substrate 10 being 0 V. Here, when no drain current is detected, a decision is made that the stored data is "0". Also, when it is judged from the amount of the detected drain current that the drain current flows only in the first memory element 100, a decision is made that the stored data is "1". Alternatively, when it is judged from the amount of the detected drain current that the drain currents flow in both of the first and second memory elements 100 and 200, a decision is made that the stored data is "2".

In the non-volatile semiconductor memory device 300 in accordance with the present embodiment, in the data writing and data reading, three kinds of data, i.e., "0", "1" and "2", can be written and read by the first and second memory elements 100 and 200 of the non-volatile semiconductor memory device 300. Accordingly, storage and reading of data can be efficiently conducted when it is applied to an apparatus that requires discriminating three kinds of information from one another, such as, for example, a color CCD and a color liquid crystal display apparatus.

Next, one example of a method for manufacturing the non-volatile semiconductor memory device 300 shown in FIGS. 1 through 3 is described with reference to FIGS. 4 through 16. FIGS. 5 through 13 and FIG. 15 schematically show cross sections of the non-volatile semiconductor memory device shown in FIGS. 1 through 3 in a manufacturing process, and show sections corresponding to a cross section taken along a line A—A of FIGS. 1 and 4. FIGS. 14 and 16 schematically show cross sections of the non-volatile semiconductor memory device shown in FIGS. 1 through 3 in a manufacturing process, and show sections corresponding to a cross section taken along a line B—B of FIG. 1.

Figure 4:
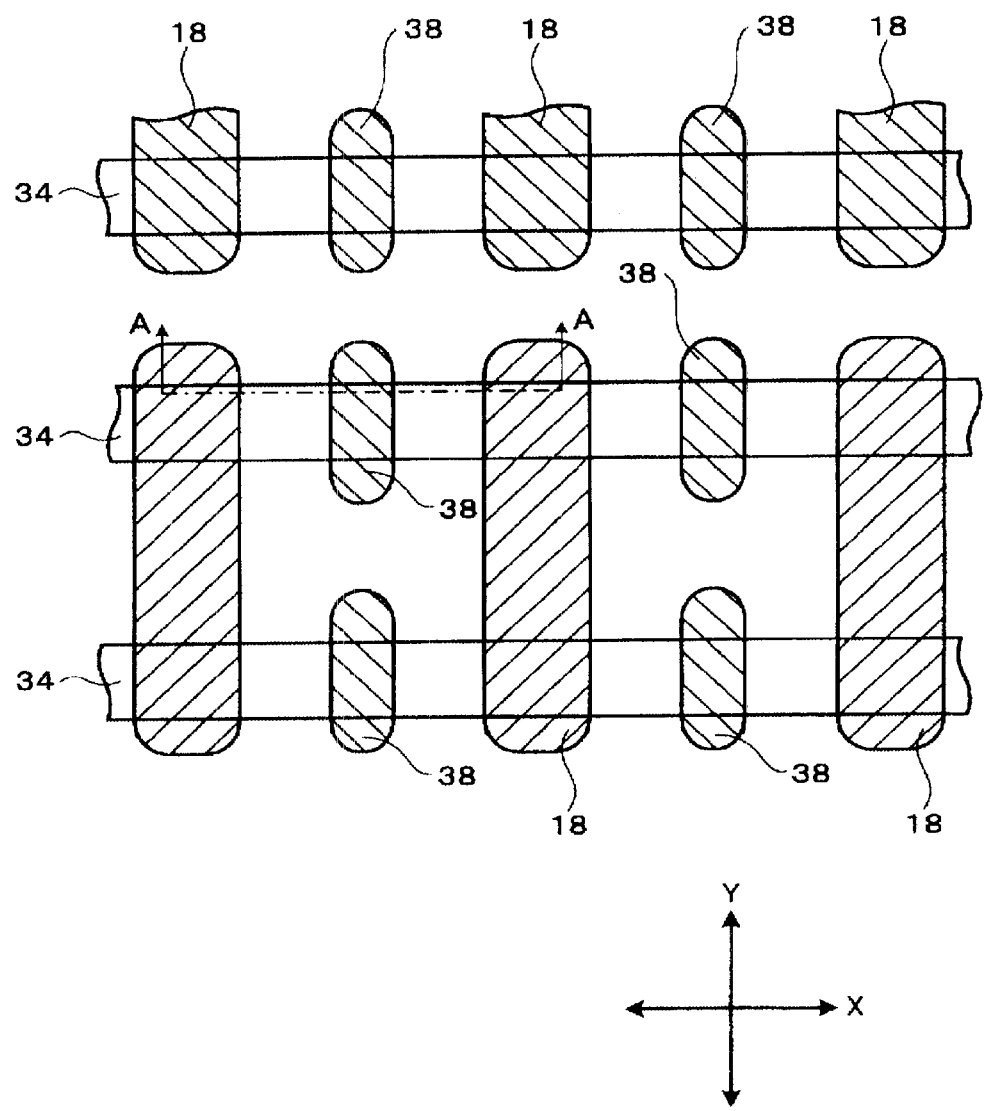
FIG. 4 schematically shows a plan view of the non-volatile semiconductor memory device shown in FIG. 1 in a manufacturing step.
Figure 5:
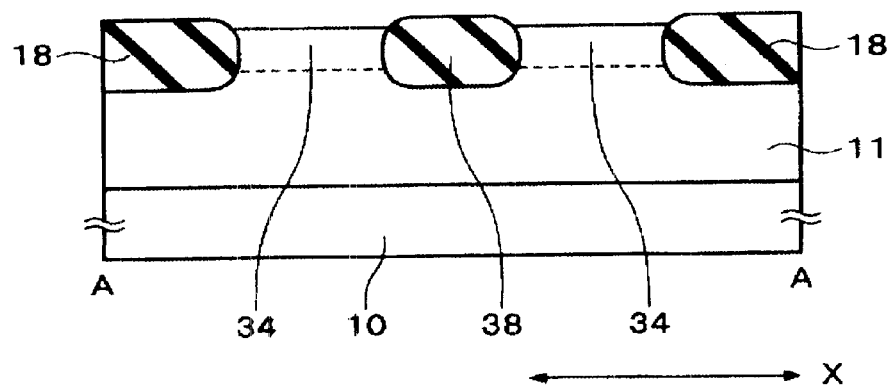
FIG. 5 shows a cross-sectional view taken along the line A—A of the non-volatile semiconductor memory device shown in FIG. 4 in a manufacturing step.

(1) First, as shown in FIGS. 4 and 5, element isolation regions 18 and 38 are formed in a well 11 of the second conductivity type (P-type) formed in the silicon substrate 10 in specified regions by, for example, a selective oxidation method, an STI (Shallow Trench Isolation) method or the like. The element isolation regions 18 and 38 are formed alternately in X direction. Then, an impurity of the first conductivity type (N-type) is introduced in areas in the well where control gates 28 are to be formed in a later step, to thereby form impurity regions 34.

Figure 6:
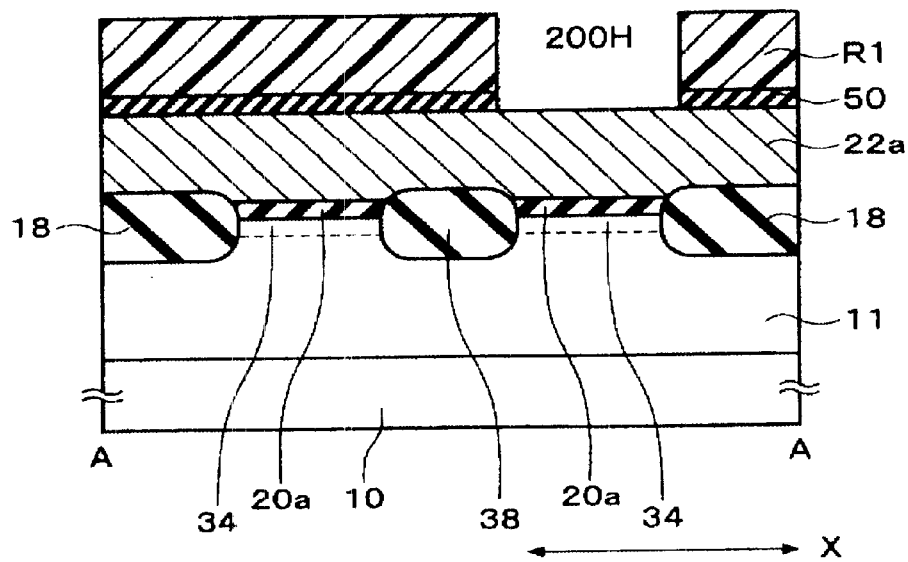
FIG. 6 schematically shows a view of the non-volatile semiconductor memory device shown in FIG. 1 in a manufacturing step, and shows a portion corresponding to the cross section taken along the line A—A in FIG. 1.

Then, as shown in FIG. 6, a silicon oxide layer 20*a* is formed in specified regions in the well 11 by, for example, a thermal oxidation method. The silicon oxide layer 20*a* is provided in a layer to form gate dielectric layers 20 and 120 of the first and second memory elements 100 and 200 (see FIG. 2) in a later step. The thickness of the gate dielectric layers 20 and 120 is not particularly limited, but may preferably be 7–8 nm in view of the gate dielectric strength and the like.

Then, a polysilicon layer is formed on the silicon oxide layer 20*a* using a CVD method, for example, and phosphorous or arsenic is diffused therein to form a polysilicon layer 22*a* of the first conductivity type (N-type). The polysilicon layer 22*a* is provided in a layer to form floating gates 22 and 122 of the respective first and second memory elements 100 and 200 (see FIG. 2) in a later step. The polysilicon layer may preferably have a thickness of 100–150 nm, for example.

The polysilicon layer may be changed to N-type by other methods. For example, in one method, after the polysilicon layer is formed, phosphorous ions or arsenic ions are implanted therein. Alternatively, after the polysilicon layer is formed, it is contacted with carrier gas containing phosphoryl chloride ($POCl_3$). Alternatively, in another method, when the polysilicon layer is formed, it is contacted with a carrier gas containing phosphine ($PH_3$).

(2) Next, a silicon nitride layer 50 is formed on a surface of the polysilicon layer 22*a* by, for example, a CVD method, and then a resist layer R1 having a specified pattern is formed on the silicon nitride layer 50. Specified regions of the silicon nitride layer 50 are selectively etched and removed by using the resist layer R1 as a mask to form grooves 200H. The grooves 200H are formed in sections immediately above gate dielectric layers 120 that are to be formed in a later step.

Figure 7:
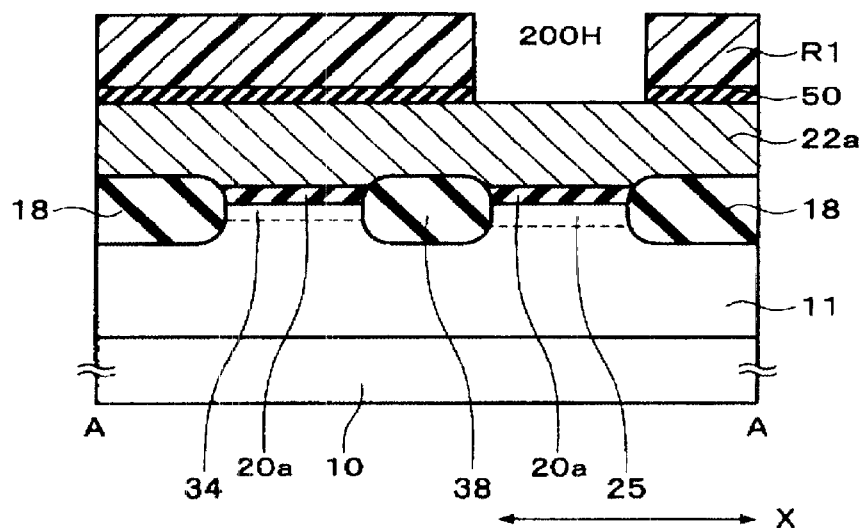
FIG. 7 schematically shows a view of the non-volatile semiconductor memory device shown in FIG. 1 in a manufacturing step, and shows a portion corresponding to the cross section taken along the line A—A in FIG. 1.
Figure 8:
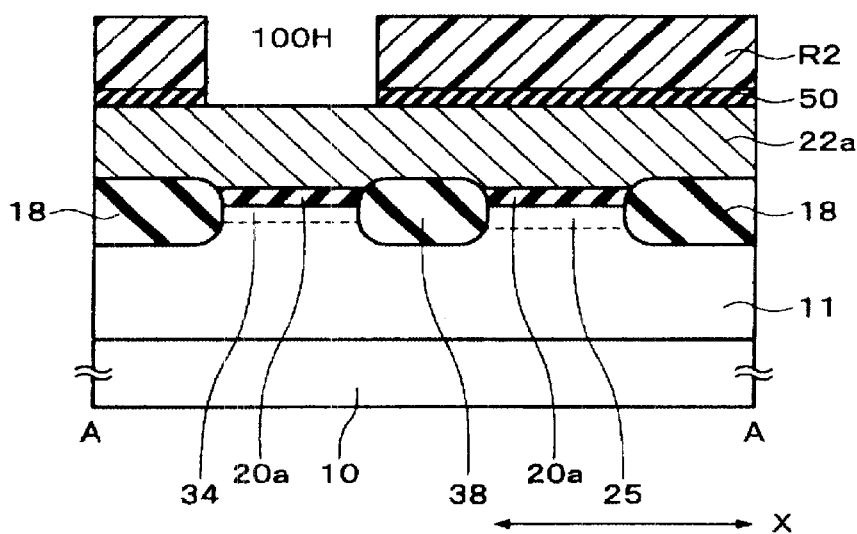
FIG. 8 schematically shows a view of the non-volatile semiconductor memory device shown in FIG. 1 in a manufacturing step, and shows a portion corresponding to the cross section taken along the line A—A in FIG. 1.

Then, by using the resist layer R1 as a mask, an impurity of the second conductivity type (P-type) is introduced in the well 11 in sections immediately below the grooves 200H, to form third impurity diffusion layers 25 that are to compose a portion of the second memory elements 200 (see FIG. 2), as shown in FIG. 7.

(3) Next, after removing the resist layer R1, a resist layer R2 having a specified pattern is formed on the silicon nitride layer 50. Specified regions of the silicon nitride layer 50 are selectively etched and removed by using the resist layer R2 as a mask to form grooves 100H (see FIG. 8). The grooves 100H are formed in sections immediately above gate dielectric layers 20 that are to be formed in a later step.

Figure 9:
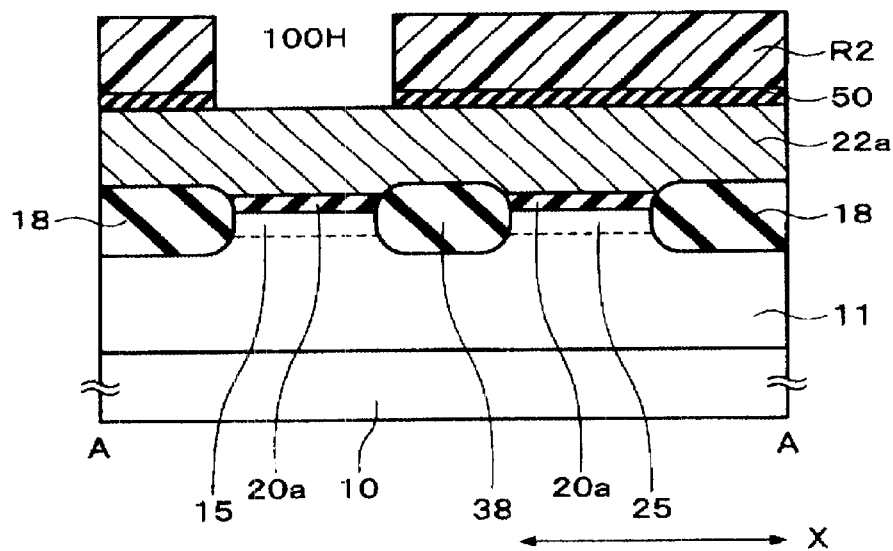
FIG. 9 schematically shows a view of the non-volatile semiconductor memory device shown in FIG. 1 in a manufacturing step, and shows a portion corresponding to the cross section taken along the line A—A in FIG. 1.

Then, by using the resist layer R2 as a mask, an impurity of the second conductivity type (P-type) is introduced in the well 11 in sections immediately below the grooves 100H, to form third impurity diffusion layers 15 that are to compose a portion of the first memory elements 100 (see FIG. 2), as shown in FIG. 9. At this time, an impurity is introduced in the third impurity diffusion layers 15 such that the impurity concentration of the third impurity diffusion layers 15 becomes higher than the impurity concentration of the third impurity diffusion layers 25. As a result, the threshold voltage of the first memory elements 100 is set to be greater than the threshold voltage of the second memory elements 200. Then, the resist layer R2 is removed.

Figure 10:
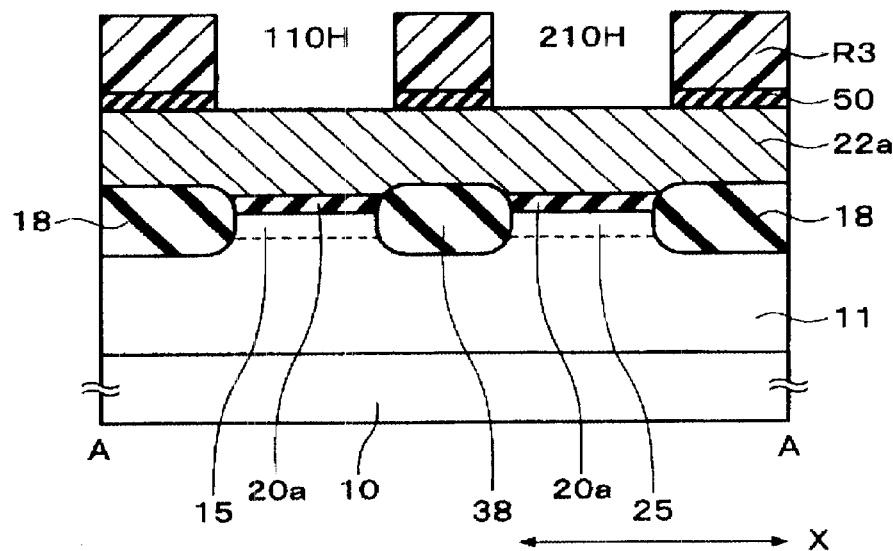
FIG. 10 schematically shows a view of the non-volatile semiconductor memory device shown in FIG. 1 in a manufacturing step, and shows a portion corresponding to the cross section taken along the line A—A in FIG. 1.

(4) Then, as shown in FIG. 10, a resist layer R3 having a specified pattern is formed on the silicon nitride layer 50. The resist layer R3 includes grooves 110H and 210H. The grooves 110H and 210H have the same shapes as those of the grooves 100H (see FIG. 8 and FIG. 9) and 200H (see FIG. 6 and FIG. 7), respectively. Then, exposed portions of the polysilicon layer 22*a* are selectively oxidized to form selective oxide dielectric layers 24 and 124 in specified regions of the polysilicon layer 22*a*. Then, the silicon nitride layer 50 is removed. The selective oxide dielectric layers 24 and 124 formed here become selective oxide dielectric layers of the first and second memory elements 100 and 200 (see FIG. 2), respectively. The selective oxide dielectric layers 24 and 124 formed by selective oxidation have a cross-sectional shape in which the film thickness is greatest at its central portion, and the film thickness gradually becomes smaller toward end sections thereof.

Figure 11:
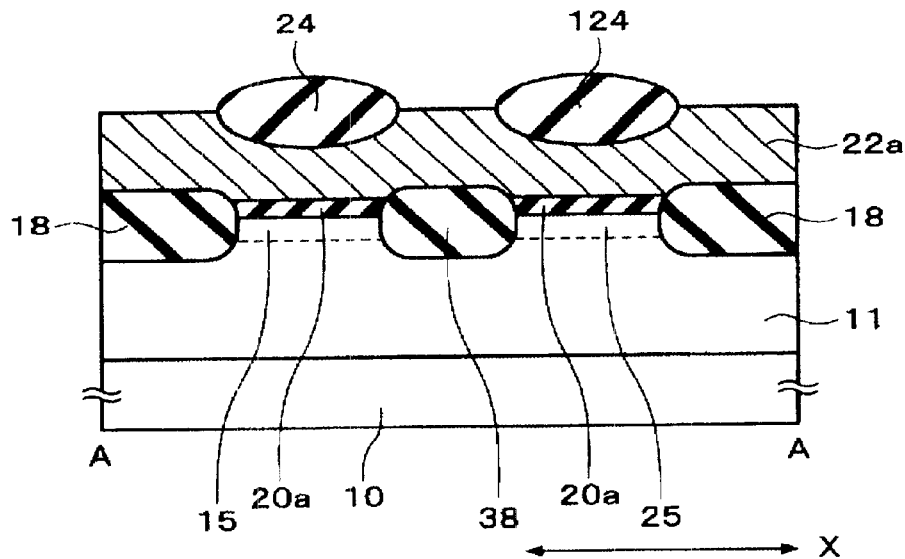
FIG. 11 schematically shows a view of the non-volatile semiconductor memory device shown in FIG. 1 in a manufacturing step, and shows a portion corresponding to the cross section taken along the line A—A in FIG. 1.
Figure 12:
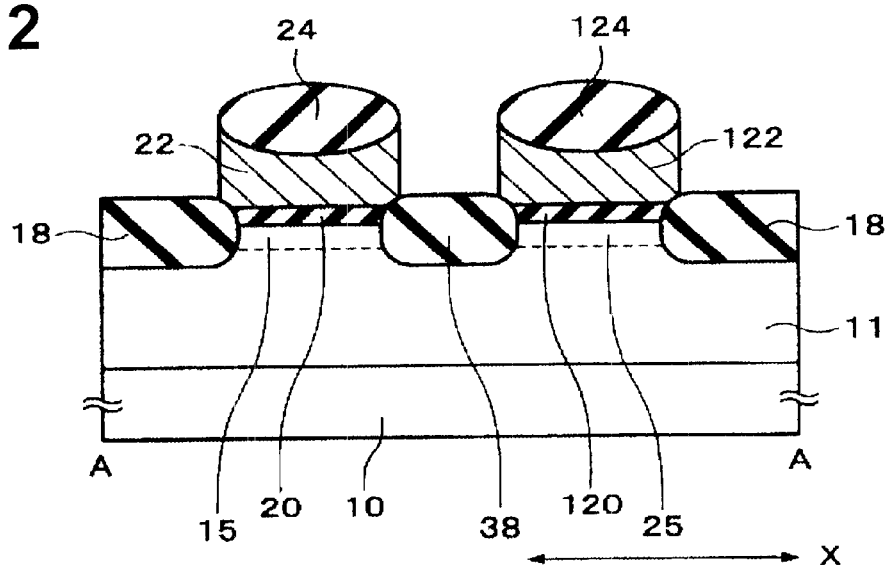
FIG. 12 schematically shows a view of the non-volatile semiconductor memory device shown in FIG. 1 in a manufacturing step, and shows a portion corresponding to the cross section taken along the line A—A in FIG. 1.

(5) Next, after the resist layer R3 is removed, an etching is conducted by using the selective oxide dielectric layers 24 and 124 as masks, to thereby pattern the polysilicon layer 22*a* shown in FIG. 11. By this step, the floating gates 22 and 122 and the gate dielectric layers 20 and 120 may be formed, as shown in FIG. 12. The floating gates 22 and 122 formed here become the floating gates of the first and second memory elements 100 and 200, respectively (see FIG. 2), and the gate dielectric layers 20 and 120 become the gate dielectric layers of the first and second memory elements 100 and 200, respectively (see FIG. 2).

Figure 13:
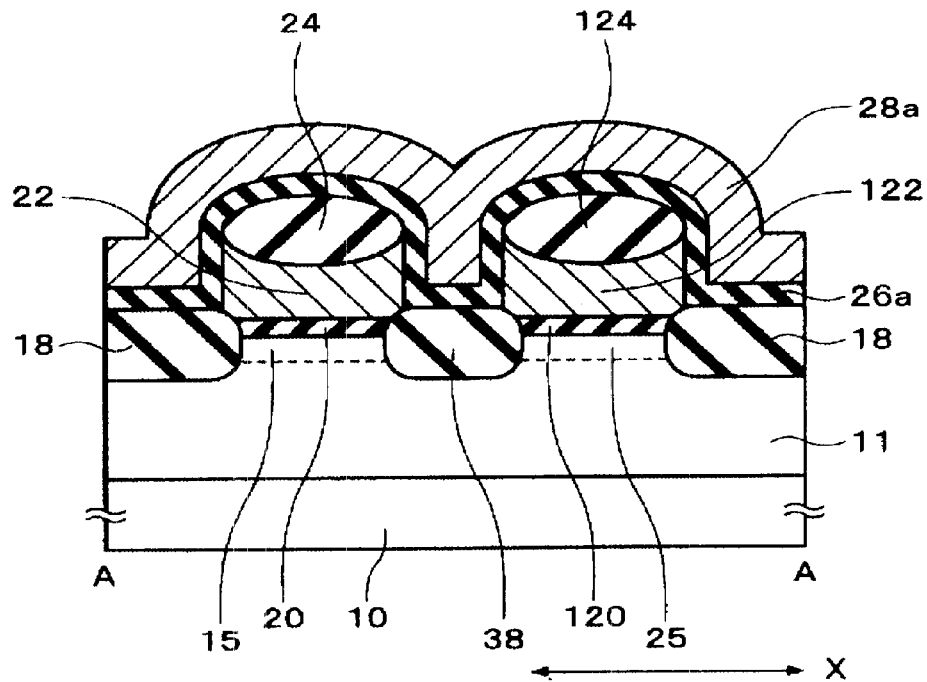
FIG. 13 schematically shows a view of the non-volatile semiconductor memory device shown in FIG. 1 in a manufacturing step, and shows a portion corresponding to the cross section taken along the line A—A in FIG. 1.
Figure 14:
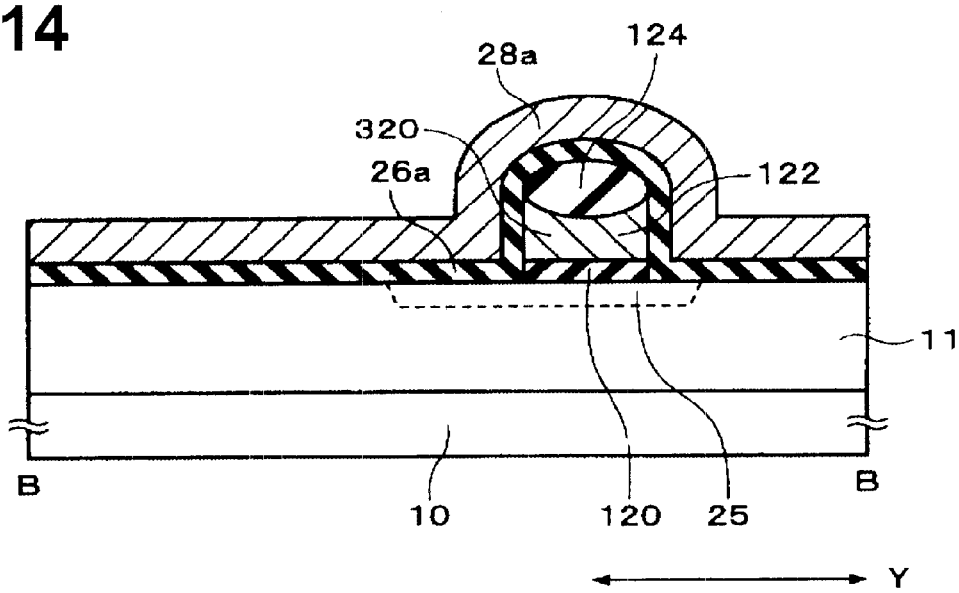
FIG. 14 schematically shows a view of the non-volatile semiconductor memory device shown in FIG. 1 in a manufacturing step, and shows a portion corresponding to the cross section taken along the line B—B in FIG. 1.

(6) Next, as shown in FIG. 13 and FIG. 14, a silicon oxide layer 26*a* is formed on the well 11. The silicon oxide layer 26*a* becomes an intermediate dielectric layer 26 (see FIG. 2) that composes a portion of the first and second memory elements 100 and 200 in a later step. The silicon oxide layer 26*a* may be formed by, for example, a thermal oxidation method or a CVD method. A preferred CVD method is a high temperature CVD method. Forming the silicon oxide layer by a high temperature CVD method provides an advantage in that the film quality of the silicon oxide layer becomes dense. The silicon oxide layer 26*a* is formed on the silicon substrate 10 to a thickness of 15–25 nm, for example. Also, the silicon oxide layer 26*a* may be formed from a plurality of layers disposed in layers.

It is noted that, depending on the requirements, the silicon oxide layer 26*a* may be subject to an anneal treatment. The anneal treatment can improve the film quality of the reformed silicon oxide layer 26a. The anneal treatment may be conducted, for example, in a nitrogen atmosphere under normal pressure. Temperature condition may be, for example, 850–1000° C., and more preferably 900–950° C. Annealing time may be, for example, 15–30 minutes, and more preferably 20–25 minutes.

(7) Next, as shown in FIG. 13 and FIG. 14, a polysilicon layer 28a is formed on a surface of the silicon oxide layer 26a by a similar method used in the step (1) described above.

Figure 15:
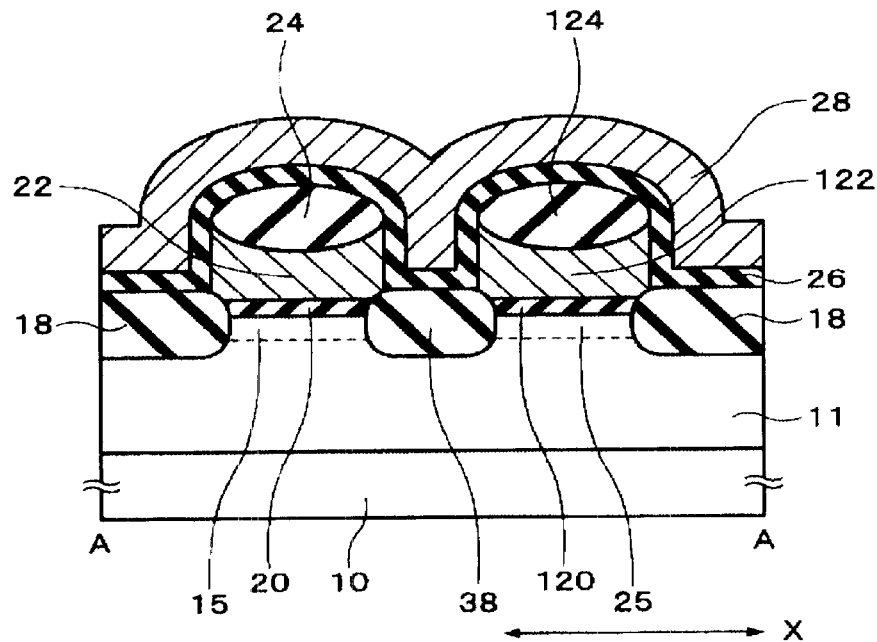
FIG. 15 schematically shows a view of the non-volatile semiconductor memory device shown in FIG. 1 in a manufacturing step, and shows a portion corresponding to the cross section taken along the line A—A in FIG. 1.
Figure 16:
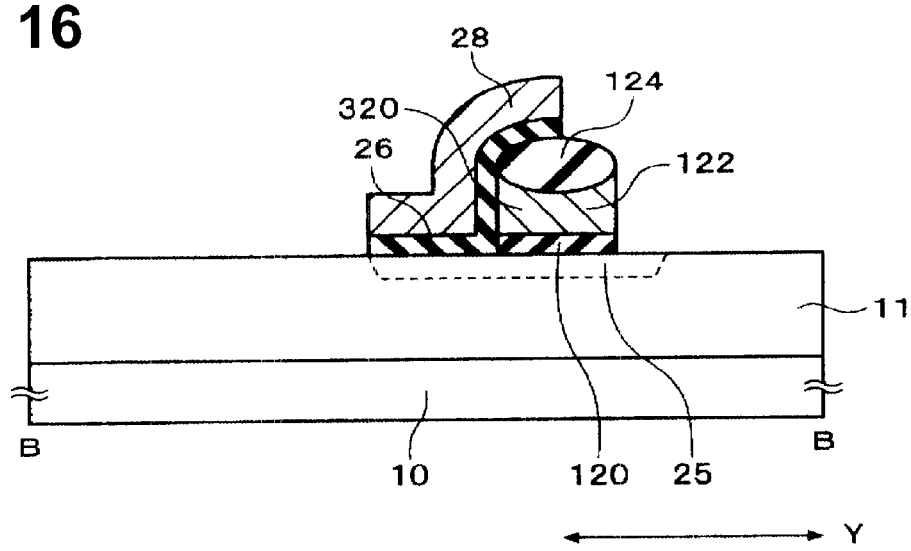
FIG. 16 schematically shows a view of the non-volatile semiconductor memory device shown in FIG. 1 in a manufacturing step, and shows a portion corresponding to the cross section taken along the line B—B in FIG. 1.

Next, a resist layer having a specified pattern is formed on the polysilicon layer 28a, and then a patterning is conducted by an etching to form intermediate dielectric layers 26 and control gates 28, as shown in FIG. 15 and FIG. 16. The intermediate dielectric layers 26 and the control gates 28 each become an intermediate dielectric layer and a control gate of the first and second memory elements 100 and 200 (see FIG. 2).

(8) Further, a resist layer that is patterned in a manner to cover a part of the selective oxide dielectric layer 24, the control gate 28 and a region that is to become the first impurity diffusion layer 16 is formed. Then, by using the resist layer as a mask, an impurity of the first conductivity type (N-type) is doped in specified regions of the well 11 by a known method to form the second impurity diffusion layers 14.

Next, a resist layer that is patterned in a manner to cover the selective oxide dielectric layer 24, a part of the control gate 28 and the second impurity diffusion layer 14 is formed. Then, an impurity of the first conductivity type (N-type) is doped in a specified region of the well 11 to form the first impurity diffusion layers 16.

By the steps described above, the first and second memory elements 100 and 200 of the non-volatile semiconductor memory device 300 shown in FIG. 1 may be formed.

(9) Next, an interlayer dielectric layer 40 comprising of a silicon oxide layer (see FIG. 2) is formed by, for example, a CVD method, on the well 11 where the first and second memory elements 100 and 200 are formed. Then, specified regions of the interlayer dielectric layer 40 are selectively etched and removed to form contact holes 33 (see FIG. 3) that reach the first impurity diffusion layers 16. Next, a conduction layer comprising aluminum or the like is deposited on an upper surface of the interlayer dielectric layer 40 and in the contact holes 33 by, for example, a sputter method. The conduction layer is patterned to form contact conduction layers 32 and metal bit wiring layers 30 (for example, bit lines) that are electrically connected to the first impurity diffusion layers 16 through the contact conduction layers 32.

By the steps described above, the non-volatile semiconductor memory device 300 shown in FIGS. 1 through 3 may be formed.

By the method for manufacturing a non-volatile semiconductor memory device in accordance with the present embodiment, an impurity is introduced in different concentrations in regions where first and second memory elements 100 and 200 are to be formed, respectively, to thereby form third impurity diffusion layers 15 and 25, such that the first and second memory elements 100 and 200 having different threshold voltages can be formed. As a result, a non-volatile semiconductor memory device that can write and read three kinds of data can be manufactured by an efficient method.

Next, a method for manufacturing a non-volatile semiconductor memory device 300 in another embodiment is described.

FIGS. 17 through 20 schematically show a method for manufacturing the non-volatile semiconductor memory device 300 shown in FIG. 1 in another example.

In the manufacturing method described above, as shown in FIGS. 6 through 9, after the silicon oxide layer 20a and the polysilicon layer 22a are formed on the wafer 11, the third impurity diffusion layers 15 and 25 that respectively compose a portion of the first and second memory elements 100 and 200 are formed. However, instead of the steps shown in FIGS. 6 through 9, the third impurity diffusion layers may be formed before the silicon oxide layer 20a and the polysilicon layer 22a are formed, as shown in FIGS. 17 through 20.

Figure 17:
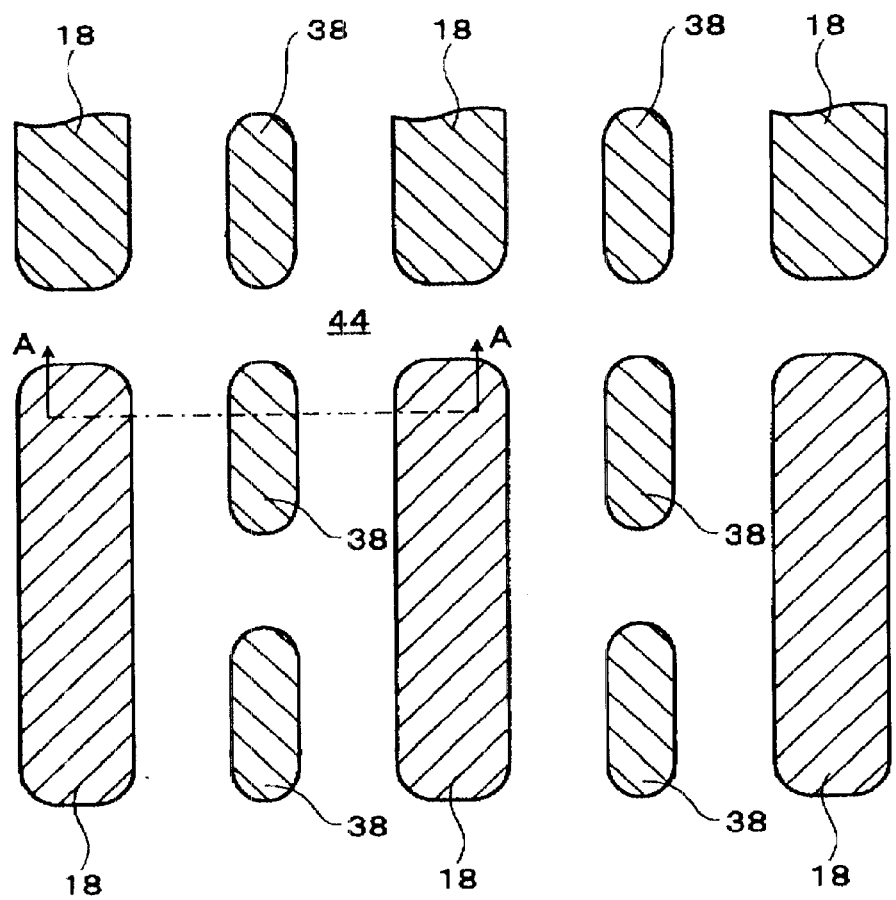
FIG. 17 schematically shows in a plan view another example of the method for manufacturing the non-volatile semiconductor memory device shown in FIG. 1.
Figure 17:
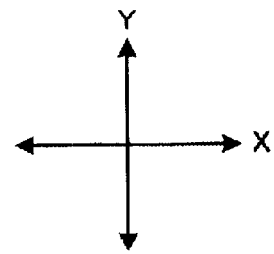
Figure 18:
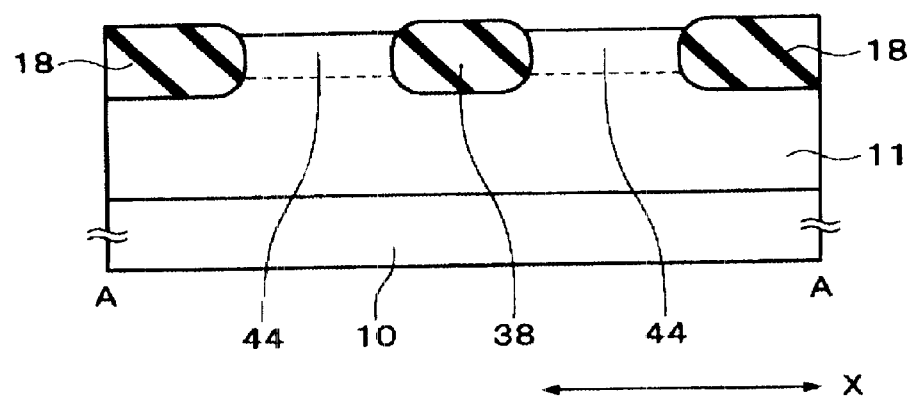
FIG. 18 schematically shows a view of the non-volatile semiconductor memory device shown in FIG. 1 in another example of the manufacturing method, and shows a portion corresponding to the cross section taken along a line A—A in FIG. 17.
Figure 19:
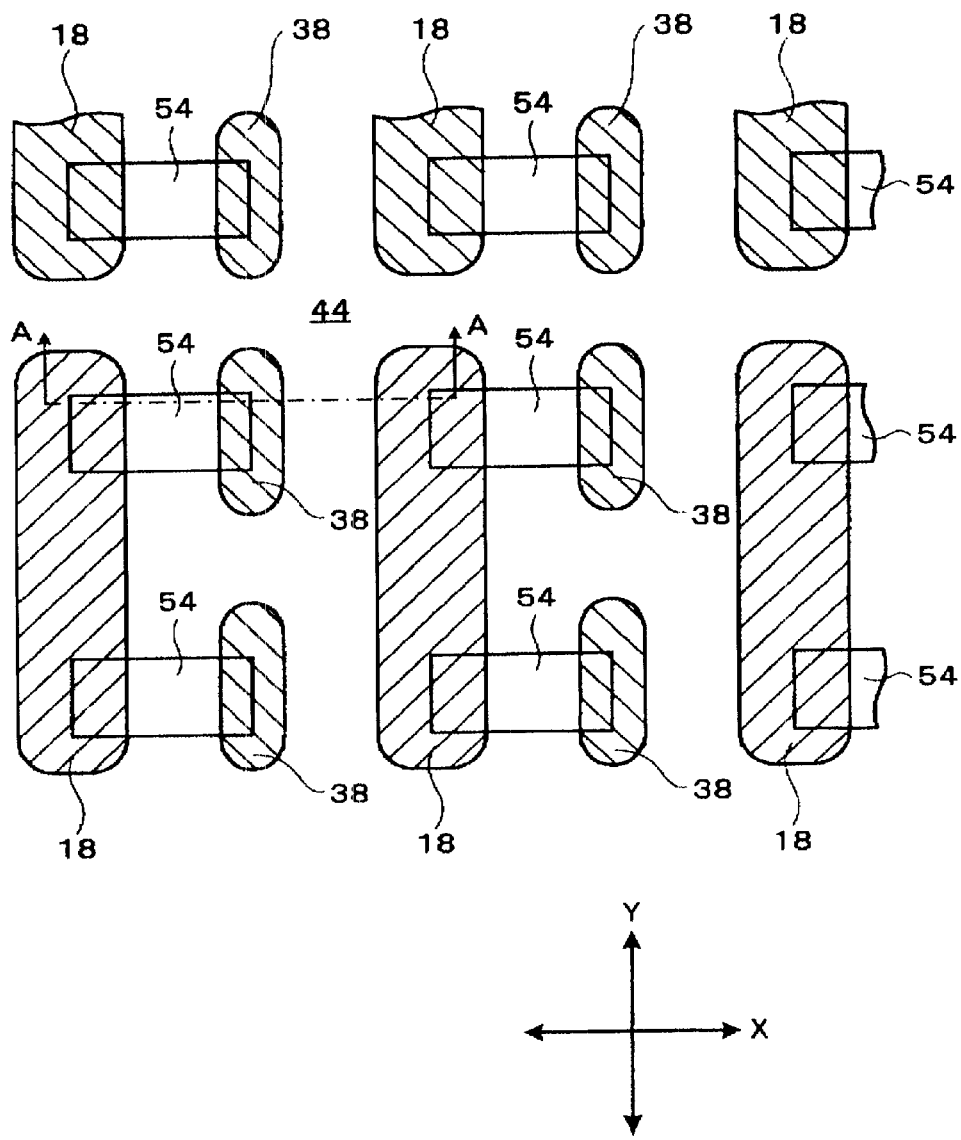
FIG. 19 schematically shows in a plan view another example of the method for manufacturing the non-volatile semiconductor memory device shown in FIG. 1.
Figure 20:
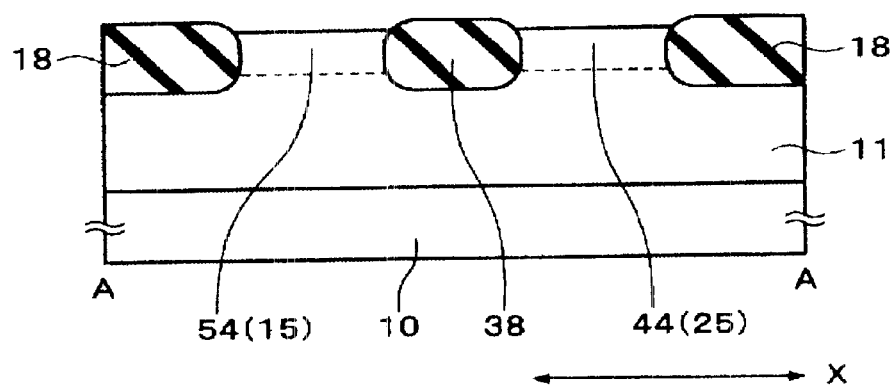
FIG. 20 schematically shows a view of the non-volatile semiconductor memory device shown in FIG. 1 in another example of the manufacturing method, and shows a portion corresponding to the cross section taken along a line A—A in FIG. 19.

First, before the silicon oxide layer 20a and the polysilicon layer 22a are formed on the wafer 11, an impurity of the second conductivity type (P-type) is doped in the entire area of the well 11 to form an impurity region 44 as shown in FIGS. 17 and 18, instead of forming the impurity region 34 in the steps shown in FIGS. 4 and 5 described above. Further, a resist layer having a pattern to cover at least portions where the second memory elements 200 are to be formed in later steps is formed, and then an impurity of the second conductivity type (P-type) is doped in regions where the resist layer is not formed, such that impurity regions 54 are formed in regions where the first memory elements 100 are to be formed in later steps, as shown in FIGS. 19 and 20. By the above, the impurity regions 54 are formed to have an impurity concentration higher than that of the impurity region 44. The impurity regions 54 and 44 formed through the steps described above become third impurity diffusion layers 15 and 25 shown in FIGS. 1 through 3. Then, the resist layer is removed. Steps to be conducted hereafter are the same as the steps shown in FIGS. 10 through 16.

According to the steps shown in FIGS. 17 through 20, the third impurity diffusion layers 15 and 25 may also be formed before the silicon oxide layer 20a and the polysilicon layer 22a are formed. By the process described above, the number of process steps is further reduced, and the non-volatile semiconductor memory device 300 in accordance with the present embodiment can be manufactured by a more simplified method.

The present invention is not limited to the embodiments described above, and many modifications can be made within the subject matter of the present invention.

For example, in certain embodiments, the order of some of the process steps (for example, impurity implantation, patterning, deposition) may be varied.

In addition, for example, in the present embodiments, the first conductivity type is N-type and the second conductivity type is P-type. However, they can be switched from one to the other in each of the semiconductor layers without departing from the subject matter of the present invention. In other words, the first conductivity type may be P-type and the second conductivity type may be N-type to achieve the functions and effects of the present invention.

Also, for example, depending on the requirements, a triple well, in which an N-type impurity (for example, arsenic or phosphorous) is diffused in the silicon substrate 10 to form a first well of N-type, and further a P-type impurity (for example, boron) is doped in the first well to form a second well of P-type in a specified region, may be used.

What is claimed:

1. A method for manufacturing a non-volatile semiconductor memory device including a first memory element in a first memory element region and a second memory element in a second memory element region, the method comprising:

providing a semiconductor substrate including a first memory element region and the second memory element region;

forming a third impurity diffusion layer in each of the first and second memory element regions, wherein an impurity concentration of the third impurity diffusion layer in the first memory element region is different from an impurity concentration of the third impurity diffusion layer in the second memory element region;

forming a gate dielectric layer, a floating gate and a selective oxide dielectric layer in each of the first memory element region and the second memory element region;

depositing a dielectric layer and depositing a conduction layer and patterning the dielectric layer and the conduction layer to form an intermediate dielectric layer and a control gate commonly shared by the first memory element and the second memory element; and forming first and second impurity diffusion layers in selected regions of the semiconductor substrate.

2. A method as in claim 1, wherein forming the third impurity diffusion layer in each of the first and second memory element regions is carried out prior to forming the gate dielectric layer, the floating gate, and the selective oxide dielectric layer in each of the first and second memory element regions.

3. A method as in claim 1, wherein forming the third impurity diffusion layer in each of the first and second memory element regions is carried out after forming the gate dielectric layer, the floating gate, and the selective oxide dielectric layer in each of the first and second memory element regions.

4. A method for manufacturing a non-volatile semiconductor memory device including a first memory element and a second memory element, the method for manufacturing a non-volatile semiconductor memory device comprising:

(a) forming an element isolation region in a semiconductor substrate to isolate the first memory element from the second memory element;

(b) introducing an impurity in each of two regions isolated by the element isolation region in the semiconductor substrate to thereby form a third impurity diffusion layer in the first memory element in one of the two regions and to form a third impurity diffusion layer in the second memory element in another region of the two regions, wherein the third impurity diffusion layer in each of the first and second memory elements is formed such that an impurity concentration of the third impurity diffusion layer in the first memory element and an impurity concentration of the third impurity diffusion layer in the second memory element are different from each other;

(c) forming a gate dielectric layer, a floating gate and a selective oxide dielectric layer for each of the first memory element and the second memory element in each of the two regions isolated by the element isolation region on the semiconductor substrate;

(d) successively depositing a dielectric layer and a conduction layer and then patterning the dielectric layer and the conduction layer into a specified shape to form an intermediate dielectric layer and a control gate commonly shared by the first memory element and the second memory element; and (e) introducing a second impurity into a specified region of the semiconductor substrate to form an impurity region that includes first and second impurity diffusion layers, to thereby form the first memory element and the second memory element.

5. A method for manufacturing a non-volatile semiconductor memory device according to claim 4, further comprising:

(f) forming an interlayer dielectric layer over the first memory element and the second memory element, and then forming a contact section that passes through the interlayer dielectric layer over the first impurity diffusion layer; and (g) embedding a second conduction layer in the contact section and forming a bit line that connects to the conduction layer on the interlayer dielectric layer.

6. A method for manufacturing a non-volatile semiconductor memory device according to claim 5, wherein the step (g) includes electrically connecting the second conduction layer and the first impurity diffusion layer.

7. A method for manufacturing a non-volatile semiconductor memory device according to claim 5, wherein the step (g) includes electrically connecting the bit line to the first and second memory elements as a common bit line for the first and second memory elements.

8. A method for manufacturing a non-volatile semiconductor memory device according to claim 4, wherein the step (b) includes introducing the impurity in specified amounts in the respective two regions isolated by the element isolation region in the semiconductor substrate to thereby form the third impurity diffusion layer in the respective first and second memory elements such that an impurity concentration of the third impurity diffusion layer in the first memory element and an impurity concentration of the third impurity diffusion layer in the second memory element are different from each other.

9. A method for manufacturing a non-volatile semiconductor memory device according to claim 4, wherein the step (b) introduces the impurity in a specified region in the semiconductor substrate immediately below the control gate such that an impurity concentration of the third impurity diffusion layer in the first memory element and an impurity concentration of the third impurity diffusion layer in the second memory element are different from each other.

10. A method for manufacturing a non-volatile semiconductor memory device according to claim 5, further comprising:

(h) introducing a third impurity at least in a part of the semiconductor substrate before forming the gate dielectric layer in the step (c).

11. A method for manufacturing a non-volatile semiconductor memory device according to claim 10, wherein the step (h) includes forming a second impurity region in a section immediately below the control gate in the semiconductor substrate.

12. A method for manufacturing a non-volatile semiconductor memory device according to claim 4, wherein concentrations of the impurity introduced in the third impurity diffusion layer in the first memory element and the third impurity diffusion layer in the second memory element are made different from each other to set a threshold voltage of the first memory element and a threshold voltage of the second memory element at different values.

13. A method for manufacturing a non-volatile semiconductor memory device including a first memory element and a second memory element, the method for manufacturing a non-volatile semiconductor memory device comprising:

(a) forming an element isolation region in a semiconductor substrate for isolating the first memory element from the second memory element, and then successively forming a dielectric layer for forming a gate dielectric layer and a conduction layer for forming a floating gate;

(b) introducing an impurity in each of two regions isolated by the element isolation region in the semiconductor substrate to thereby form a third impurity diffusion layer in the first memory element in one of the two regions and to form a third impurity diffusion layer in the second memory element in another region of the two regions, wherein the third impurity diffusion layer in each of the first and second memory elements is formed such that an impurity concentration of the third impurity diffusion layer in the first memory element and an impurity concentration of the third impurity diffusion layer in second memory element are different from each other;

(c) selectively oxidizing a part of the conduction layer for forming a floating gate to thereby form a selective oxide dielectric layer for the first memory element and the second memory element, and then patterning the dielectric layer for forming a gate dielectric layer and the conduction layer for forming a floating gate into a specified shape, to thereby form gate dielectric layer and the floating gate for each of the first memory element and the second memory element in the respective two regions isolated by the element isolation region on the semiconductor substrate;

(d) successively depositing the dielectric layer for forming an intermediate dielectric layer and a second conduction layer for forming a control gate and patterning second the dielectric layer and the conduction layer into a specified shape to form the intermediate dielectric layer and the control gate commonly shared by the first memory element and the second memory element; and (e) introducing a second impurity into a specified region of the semiconductor substrate to form an impurity region that includes first and second impurity diffusion layers, to thereby form the first memory element and the second memory element.

14. A method for manufacturing a non-volatile semiconductor memory device according to claim 13, further comprising:

(f) forming an interlayer dielectric layer over the first memory element and the second memory element, and then forming a contact section that passes through the interlayer dielectric layer over the first impurity diffusion layer; and (g) embedding a third conduction layer in the contact section and forming a bit line that connects to the third conduction layer on the interlayer dielectric layer.

15. A method for manufacturing a non-volatile semiconductor memory device according to claim 14, wherein the step (g) includes electrically connecting the conduction layer and the first impurity diffusion layer.

16. A method for manufacturing a non-volatile semiconductor memory device according to claim 14, wherein the step (g) includes electrically connecting the bit line to the first and second memory elements as a common bit line for the first and second memory elements.

17. A method for manufacturing a non-volatile semiconductor memory device according to claim 13, wherein the step (b) includes introducing the impurity in specified amounts in the respective two regions isolated by the element isolation region in the semiconductor substrate to thereby form the third impurity diffusion layer in the respective first and second memory elements such that an impurity concentration of the third impurity diffusion layer in the first memory element and an impurity concentration of the third impurity diffusion layer in the second memory element are different from each other.

18. A method for manufacturing a non-volatile semiconductor memory device according to claim 13, wherein the step (b) introduces the impurity in a specified region in the semiconductor substrate immediately below the control gate such that an impurity concentration of the third impurity diffusion layer in the first memory element and an impurity concentration of the third impurity diffusion layer in the second memory element are different from each other.

19. A method for manufacturing a non-volatile semiconductor memory device according to claim 14, further comprising:

(h) introducing a third impurity at least in a part of the semiconductor substrate before forming the gate dielectric layer in the step (c).

20. A method for manufacturing a non-volatile semiconductor memory device according to claim 19, wherein the step (h) includes forming a second impurity region in a section immediately below the control gate in the semiconductor substrate.

21. A method for manufacturing a non-volatile semiconductor memory device according to claim 13, wherein concentrations of the impurity introduced in the third impurity diffusion layer in the first memory element and the third impurity diffusion layer in the second memory element are made different from each other to set a threshold voltage of the first memory element and a threshold voltage of the second memory element at different values.

* * * * *